US011686791B2

(12) United States Patent
Klomp et al.

(10) Patent No.: US 11,686,791 B2
(45) Date of Patent: Jun. 27, 2023

(54) MRI SYSTEMS AND RECEIVE COIL ARRANGEMENTS

(71) Applicants: Tesla Dynamic Coils BV, Zaltbommel (NL); Futura Composites B.V., Heerhugowaard (NL); UMC Utrecht Holding B.V., Utrecht (NL)

(72) Inventors: Dennis Klomp, Utrecht (NL); Stefan Zijlema, Utrecht (NL); Catalina Arteaga De Castro, Zaltbommel (NL); Martino Borgo, Heerhugowaard (NL)

(73) Assignees: Tesla Dynamic Coils BV, Zaltbommel (NL); Futura Composites B.V., Heerhugowaard (NL); UMC Utrecht Holding B.V., Utrecht (NL)

( * ) Notice: Subject to any disclaimer, the term of this patent is extended or adjusted under 35 U.S.C. 154(b) by 0 days.

(21) Appl. No.: 17/517,759

(22) Filed: Nov. 3, 2021

(65) Prior Publication Data
US 2022/0137163 A1 May 5, 2022

(51) Int. Cl.
*G01R 33/341* (2006.01)
*G01R 33/36* (2006.01)

(52) U.S. Cl.
CPC ....... *G01R 33/341* (2013.01); *G01R 33/3635* (2013.01)

(58) Field of Classification Search
CPC .......................... G01R 33/341; G01R 33/3635
See application file for complete search history.

(56) References Cited

U.S. PATENT DOCUMENTS

| 4,812,764 A   | 3/1989  | Bendall             |              |
|---------------|---------|---------------------|--------------|
| 6,097,186 A * | 8/2000  | Nabetani ............ | G01R 33/3415 |
|               |         |                     | 324/318      |
| 6,591,128 B1* | 7/2003  | Wu .................... | G01R 33/3415 |
|               |         |                     | 324/318      |
| 6,593,744 B2  | 7/2003  | Burl et al.         |              |

(Continued)

FOREIGN PATENT DOCUMENTS

EP            3588119 A1 *  1/2020   ........... A61B 5/0205

OTHER PUBLICATIONS

Jana M. Vincent; "Stitching Stretchable Radiofrequency Coils for MRI: A Conductive Thread and Athletic Fabric Approach"; 2019 41st Annual International Conference of the IEEE Engineering in Medicine and Biology Society (EMBC); Jul. 23-27, 2019; pp. 6798-6801; Institute of Electrical and Electronics Engineers; United States.

(Continued)

*Primary Examiner* — Dixomara Vargas
(74) *Attorney, Agent, or Firm* — McCormick, Paulding & Huber PLLC (57) ABSTRACT

An MRI system receive coil arrangement 3 for use with a main MRI scanner arrangement. The arrangement includes at least one primary receive coil 6 having a first impedance at a predetermined frequency and a first size defined by a cross-sectional area bounded by the primary receive coil and at least one auxiliary receive coil 7 having a second impedance at said predetermined frequency and a second size defined by a cross-sectional area bounded by the auxiliary receive coil wherein the first impedance is lower than the second impedance and the first size is larger than the second size.

25 Claims, 10 Drawing Sheets

(56) References Cited

U.S. PATENT DOCUMENTS

| | | | |
|---|---|---|---|
| 7,382,132 B1* | 6/2008 | Mathew | G01R 33/34084 324/318 |
| 7,526,330 B1* | 4/2009 | Randell | A61B 5/055 324/309 |
| 8,934,959 B2* | 1/2015 | Peligrad | A61K 51/12 250/363.04 |
| 2003/0122546 A1* | 7/2003 | Leussler | G01R 33/341 324/318 |
| 2003/0210049 A1* | 11/2003 | Boskamp | G01R 33/365 324/309 |
| 2005/0107686 A1* | 5/2005 | Chan | G01R 33/3415 600/422 |
| 2007/0016003 A1 | 1/2007 | Piron et al. | |
| 2009/0192382 A1* | 7/2009 | Nistler | G01R 33/3678 324/322 |
| 2009/0230965 A1* | 9/2009 | DeVries | G01R 33/34061 324/322 |
| 2011/0031970 A1* | 2/2011 | Ninomiya | G01R 33/3415 324/309 |
| 2011/0279119 A1* | 11/2011 | Driemel | G01R 33/3415 324/318 |
| 2013/0221968 A1* | 8/2013 | Habara | H01Q 21/20 324/322 |
| 2015/0015259 A1 | 1/2015 | Duan et al. | |
| 2016/0209515 A1* | 7/2016 | Da Silva Rodrigues | A61B 6/037 |
| 2018/0078784 A1* | 3/2018 | Schnarr | A61N 5/1031 |
| 2018/0078787 A1* | 3/2018 | Schadewaldt | A61B 5/055 |
| 2018/0117361 A1* | 5/2018 | Pencea | A61N 5/1075 |
| 2018/0143280 A1* | 5/2018 | Dyvorne | G01R 33/5608 |
| 2018/0153431 A1* | 6/2018 | Amies | A61B 5/055 |
| 2018/0193674 A1* | 7/2018 | Brooks | A61N 5/1084 |
| 2018/0224512 A1* | 8/2018 | Poole | G01R 33/3858 |
| 2018/0238978 A1* | 8/2018 | McNulty | G01R 33/365 |
| 2020/0271739 A1 | 8/2020 | Zhu | |

OTHER PUBLICATIONS

Zhang; Nature Biomedical Engineering; Mar. 7, 2019; p. 16; Nature Publishing Group; United States.

UKIPO Search Report for corresponding UK Application No. GB2017436.3.

\* cited by examiner

MRI SYSTEMS AND RECEIVE COIL ARRANGEMENTS

CROSS-REFERENCE TO RELATED APPLICATION

This application claims foreign priority benefits under 35 U.S.C. § 119 to British Patent Application No. 2017436.3 filed on Nov. 4, 2020, the content of which is hereby incorporated by reference in its entirety.

TECHNICAL FIELD

This invention relates to MRI systems including receive coil arrangements and to receive coil arrangements for use in MRI systems as well as in some embodiments, combined systems such as MR-Linac and PET-MR systems where there is an MRI system used in combination with another system which relies on a source of radiation.

An MRI system typically comprises a main MRI scanner arrangement, a patient support or bed on which a patient lies during scanning and in at least some cases a separate, local, receive coil arrangement (or body part specific receive coil) which is arranged for location in the region of a particular body part which it is desired to scan.

The main MRI scanner arrangement typically comprises a main magnet, gradient coils, RF transmit coils, and receive coils all arranged in a main unit with a bore in which the patient is positioned during scanning. Where present, a body part specific receive coil will typically also be positioned in the bore during scanning.

As is well known MRI (magnetic resonance imaging) systems are widely used for imaging subjects and can also be used in combination systems such as MR-Linac and PET-MR systems. These combine magnetic resonance imaging with other techniques making use of radiation say for treatment, say in MR-Linac or to provide functional imaging say in PET-MR. In MRI operation, the magnet creates a large static magnetic field Bo, the RF transmit coils generate an alternating magnetic field Bi and the receive coils, whether provided in the main unit or in a body part specific receive coil are arranged for collecting a magnetic resonance signal (that is to say acquiring magnetic resonance data). The gradient coils are used to allow spatial encoding on the Bo field to enable tomographic imaging.

When an MRI system is operated using just the receive coils provided in the main unit of the scanning apparatus, the resolution and accuracy of the results can be limited in some cases. This leads to the use of separate, one may say local, receive coils, say body part specific coils as mentioned above which aim to improve imaging of a selected location/body part.

However there are limitations with existing body part specific receive coil arrangements. These include that it may be a cumbersome operation to position the receive coil arrangement around the specific body part or position the specific body part in the arrangement and/or the receive coil arrangement may give inadequate imaging results for an area of interest and/or the receive coil arrangement may be incompatible with the use of other systems such as systems using a source of radiation, for example, a linear accelerator or positron emission tomography system.

Thus, it would be desirable to provide MRI system receive coil arrangements which are aimed at addressing at least one of these issues as well as MRI systems and combined therapy and/or imaging systems which include such an MRI system receive coil arrangement.

BACKGROUND

According to a first aspect of the invention there is provided an MRI system receive coil arrangement for use with a main MRI scanner arrangement and comprising at least one primary receive coil having a first impedance at a predetermined frequency and a first size defined by a cross-sectional area bounded by the primary receive coil and at least one auxiliary receive coil having a second impedance at said predetermined frequency and a second size defined by a cross-sectional area bounded by the auxiliary receive coil wherein the first impedance is lower than the second impedance and the first size is larger than the second size.

This allows the provision of a coil arrangement where the primary receive coil helps in obtaining signals from regions relatively deep in a subject to be imaged (although still local to the receive coil arrangement) and the auxiliary receive coil helps in obtaining signals from a region relatively close to the location of the auxiliary receive coil.

Preferably the receive coil arrangement comprises a plurality of auxiliary receive coils each of which has an impedance at said predetermined frequency which is higher than the first impedance and each of which has a size defined by a cross-sectional area bounded by the respective auxiliary receive coil which is smaller than the first size.

As these auxiliary receive coils have relatively high impedance the problem of mutual coupling between the coils and their surroundings will be reduced.

Whilst the provision of one primary receive coil is generally preferred, in some embodiments the receive coil arrangement comprises a plurality of primary receive coils. In such a case the plurality of primary receive coils will typically be maintained in a precise positional relationship to each other to minimise mutual coupling—for example the plurality of primary receive coils may be mounted on a rigid support.

The receive coil arrangement may be a body part specific receive coil arrangement arranged for use in imaging a predetermined part of a subject.

The receive coil arrangement may comprise support structure on which at least one of the primary receive coil and the auxiliary coil is carried.

The support structure may hold at least one of the primary receive coil and the auxiliary coil in a desired shape.

The support structure may comprise locating means for holding at least one of the primary receive coil and the auxiliary coil in a desired shape.

The locating means may comprise fastening means. The locating means may comprise one or more groove or channel.

The support structure may comprise at least two portions, a first of which portions carries the primary receive coil and a second of which portions carries the auxiliary receive coil.

The at least two portions of the support structure may be arranged to be moveable between an access configuration allowing location of a subject between the two portions of the support structure and an operative configuration for locating the primary receive coil and auxiliary receive coil in a desired location relative to one another for use during imaging operation of an MRI machine with which the receive coil arrangement is to be used.

This can allow easy introduction of a portion of a subject into the receive coil arrangement and/or allow easy fitting of the receive coil arrangement on a subject, whilst allowing correct positioning of the coils relative to a subject for imaging.

The at least one auxiliary receive coil may be more flexible than the primary receive coil.

This can assist in mounting the at least one auxiliary receive coil to the respective support portion. It may facilitate the use of a relatively flexible support portion for supporting the at least one auxiliary receive coil.

The support portion supporting the at least one auxiliary receive coil may be more flexible than the support portion supporting the primary receive coil.

One of the at least two support portions may comprise a base portion for resting on, or incorporation into, a patient support bed of an MRI machine.

The other of the least two support portions may comprise a cover portion for mounting on the base portion. Hook and loop fastening means may be provided for securing the cover portion on the base portion.

The base portion may carry the primary receive coil. The cover portion may carry the auxiliary receive coil. Preferably there are a plurality of auxiliary receive coils, each of which is carried by the cover portion.

The cover portion may comprise a plastics material substrate that carries the at least one auxiliary receive coil and a foam material layer covering the at least one auxiliary receive coil.

The cover portion may comprise at least one fastening means for holding the at least one auxiliary receive coil in position on the substrate. The fastening means may comprise thread. The at least one auxiliary receive coil may be sewn in position.

The cover portion may comprise a plurality of covering portions, each for covering a respective portion of interest in a subject, and at least one respective auxiliary receive coil in the plurality of auxiliary receive coils being provided on a respective covering portion in the plurality of covering portions.

The receive coil arrangement may be a head and/or face and/or neck and/or shoulder receive coil arrangement.

The base portion may comprise at least part of a pillow portion for supporting a subject's head. The cover portion may be arranged for location over a subject's head and/or face and/or neck and/or shoulder. The cover portion may have at least one of a head covering portion, a face covering portion, a neck covering portion, and a shoulder covering portion.

At least one auxiliary receive coil in the plurality of auxiliary receive coils may be provided on a face covering portion, and/or at least one auxiliary receive coil in the plurality of auxiliary receive coils may be provided on a neck covering portion, and/or at least one auxiliary receive coil in the plurality of auxiliary receive coils may be provided on a head covering portion and/or at least one auxiliary receive coil in the plurality of auxiliary receive coils may be provided on a shoulder covering portion.

In one set of embodiments the receive coil arrangement comprises a plurality of auxiliary receive coils, each of which is carried by the cover portion and the cover portion has a face covering portion and a neck covering portion, with at least one auxiliary receive coil in the plurality of auxiliary receive coils being provided on the face covering portion, and/or at least one auxiliary receive coil in the plurality of auxiliary receive coils being provided on the neck covering portion.

In a subset of such embodiments, the cover portion may further comprise a head covering portion and in such a case at least one auxiliary receive coil in the plurality of auxiliary receive coils may be provided on the head covering portion.

In another subset of such embodiments, the cover portion may further comprise a shoulder covering portion and in such a case at least one auxiliary receive coil in the plurality of auxiliary receive coils may be provided on the shoulder covering portion.

In another set of embodiments the receive coil arrangement comprises a plurality of auxiliary receive coils, each of which is carried by the cover portion and the cover portion has a face covering portion and a head covering portion, with at least one auxiliary receive coil in the plurality of auxiliary receive coils being provided on the face covering portion, and/or at least one auxiliary receive coil in the plurality of auxiliary receive coils being provided on the head covering portion.

The receive coil arrangement may be arranged to allow use in addition to, that is, around an immobilization mask or other jig provided for radiotherapy treatment.

The cover portion may be arranged to have at least a radiolucent portion.

The receive coil arrangement may comprise an electronic component free zone which corresponds to a zone at which radiation may pass in use, say a radiotherapy beam applied during use, or radiation for use in forming images.

The receive coil arrangement may be arranged for use in a method or system with radiotherapy alongside MRI, say as part of a MR-Linac system.

The receive coil arrangement may be arranged for use in a method or system with radiation-based imaging alongside MRI, say as part of a PET-MR system.

The receive coil arrangement may comprise at least one tuning capacitor for tuning at least one of the respective receive coils.

The at least one tuning capacitor may be located outside of the electronic component free zone.

The at least one auxiliary receive coil may comprise at least one length of coaxial cable.

The at least one auxiliary receive coil may comprise a length of coaxial cable arranged in a loop with a gap provided in the outer conductor of the coaxial cable at a location partway around the loop and with the outer conductor at a first end of the length of coaxial cable being connected to the outer conductor at a second end of the length of coaxial cable.

Each end of the length of coaxial cable may be connected to a matching board.

The primary receive coil may comprise at least one unshielded conductor portion.

The primary receive coil may comprise two unshielded conductor portions arranged together in a loop. A respective first end of each unshielded conductor portion may be connected to a matching board and a respective second end of each unshielded conductor portion may be connected to a de-tune board.

The first support portion may comprise at least one channel or recess in which at least a portion of the at least one unshielded conductor portion is received.

The first support portion may comprise a plate portion and a pair of upstand portions that project from the plate portion. A first portion of primary receive coil may be carried on the plate portion, whilst second and third portions of the primary receive coil may be carried on the pair of upstanding portions.

In one set of embodiments, the plate portion comprises a plate channel in which a first portion of primary receive coil is received, a first of the pair of upstand portions comprises a first upstand channel in which the second portion of the primary coil is received, and a second of the pair of upstand portions comprises a second upstand channel in which the third portion of the primary coil is received.

In one embodiment the receive coil arrangement comprises one primary receive coil and seven auxiliary receive coils.

According to another aspect of the invention there is provided a cover portion arrangement for use in a receive coil arrangement as defined above which cover portion arrangement comprises a plurality of auxiliary receive coils of the receive coil arrangement and a cover portion which carries and supports each of the auxiliary receive coils.

According to another aspect of the invention there is provided an MRI system comprising a main MRI scanner arrangement, a patient support, and an MRI system receive coil arrangement as defined above provided on the patient support and electrically connected to the main MRI scanner arrangement.

The receive coil arrangement may comprise support structure on which at least one of the primary receive coil and the auxiliary coil is carried and at least part of the support structure may be mountable on or form part of the patient support.

In one set of embodiments, the support structure may comprise a base portion which carries the primary receive coil and which is mountable on or forms part of the patient support.

According to another aspect of the invention there is provided an MR-Linac system comprising an MRI system as defined above and a medical linear accelerator system.

According to another aspect of the invention there is provided a PET-MR system comprising an MRI system as defined above and a positron emission tomography system.

Note that, in general terms and with any necessary modifications in wording, all of the further features defined above following any aspect of the invention above are applicable as further features of all other aspects of the invention defined above. These further features are not restated after each aspect of the invention merely for the sake of brevity.

BRIEF DESCRIPTION OF THE DRAWINGS

Embodiments of the present invention will now be described, by way of example only, with reference to the accompanying drawings in which.

DETAILED DESCRIPTION

Figure 1:
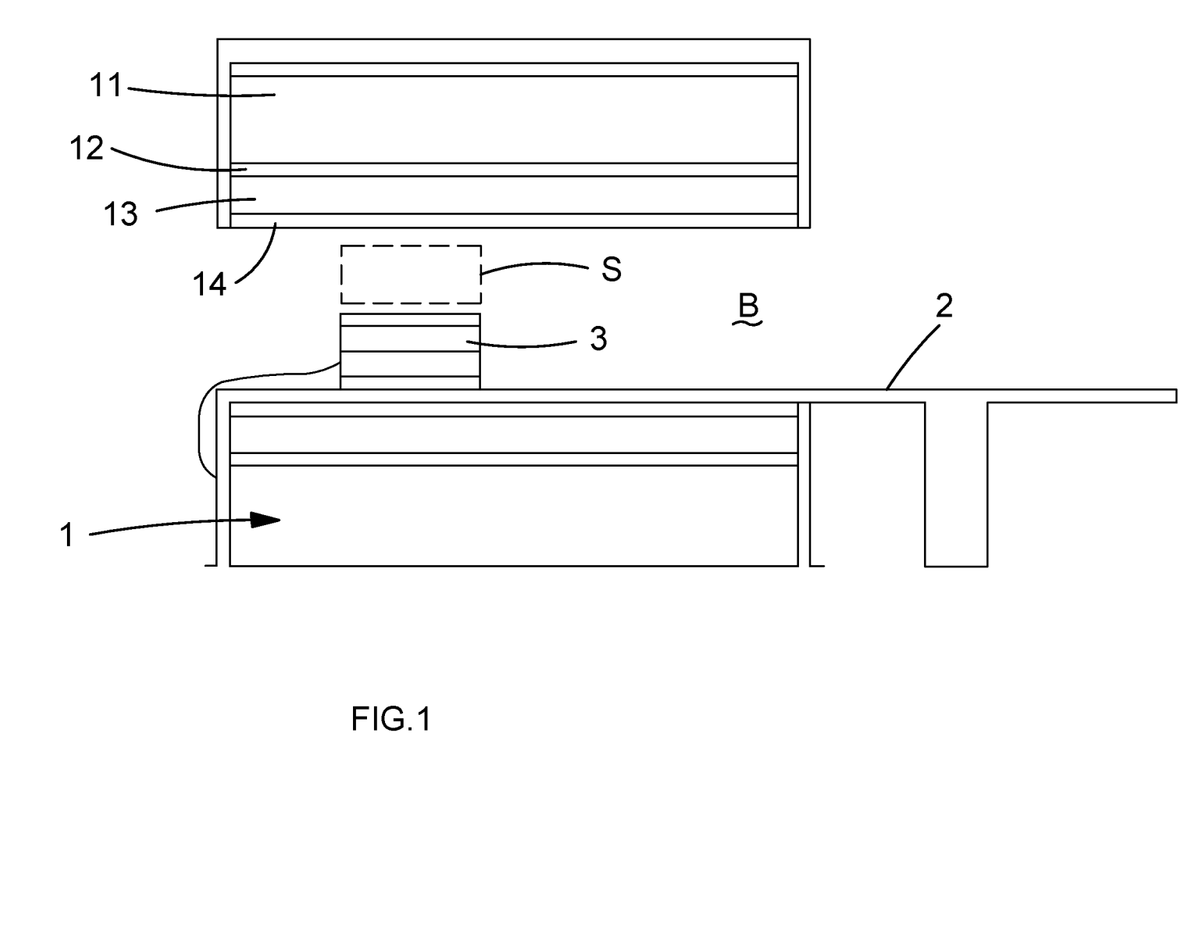
FIG. 1 schematically shows an MRI system including a receive coil arrangement.

FIG. 1 shows an MRI system comprising a main scanner arrangement 1, a patient support 2 which is arranged for supporting a patient when in the scanner arrangement 1 and an MRI system receive coil arrangement 3 which is separate from the main scanner arrangement and which in this embodiment is a body part specific receive coil arrangement. More generally such a receive coil arrangement 3 may be termed a local receive coil arrangement.

As alluded to above, in some instances an MRI system will be used in combination with other systems so as to provide for example, an MR-Linac system which comprises an MRI system and a medical linear accelerator system; or in another example, so as to provide a PET-MR system comprising an MRI system and a positron emission tomography system. In such a case, the MRI system shown in FIG. 1 may be supplemented by a linear accelerator system or positron emission tomography system S illustrated in dotted lines only in highly schematic form in FIG. 1.

The main MRI scanner arrangement 1 may be an entirely conventional main MRI scanner arrangement comprising a main magnet 11 which will typically be a superconducting electromagnet, RF transmit coils 12, gradient coils 13 and main unit receive coils 14. These components are provided in a main body of the MRI scanner arrangement 1 which has a main bore B in which the patient support 2 is provided or, more typically, into which the patient support 2 can be moved carrying a patient until an operative position is reached.

At least in use the body part specific receive coil arrangement 3 is also provided in this main bore B. Where present at least part of a medical linear accelerator system or positron emission tomography system S may also be located in this main bore B during operation.

As well as being located in the main bore B of the main MRI scanner 1 during operation, the receive coil arrangement 3 is electrically connected to the main scanner arrangement 1 such that the magnetic resonance signals picked up by the receive coil arrangement 3 may be fed into the main scanner arrangement 1 for processing.

The signals picked up by the receive coil arrangement 3 may be used alone or in combination with signals picked up by the main unit receive coils 14 in processing and generating images. In some instances a main MRI scanner arrangement 1 without its own main unit receive coils 14 could be used with the present type of receive coil arrangement 3.

The structure and operation of MRI scanner arrangements is well developed and understood and the present ideas relate to the receive coil arrangement 3 for use with such an MRI scanner arrangement. Therefore, further description of the structure and operation of the MRI scanner arrangement 1 is not necessary and the remainder of this description relates to the receive coil arrangement 3.

Figure 2:
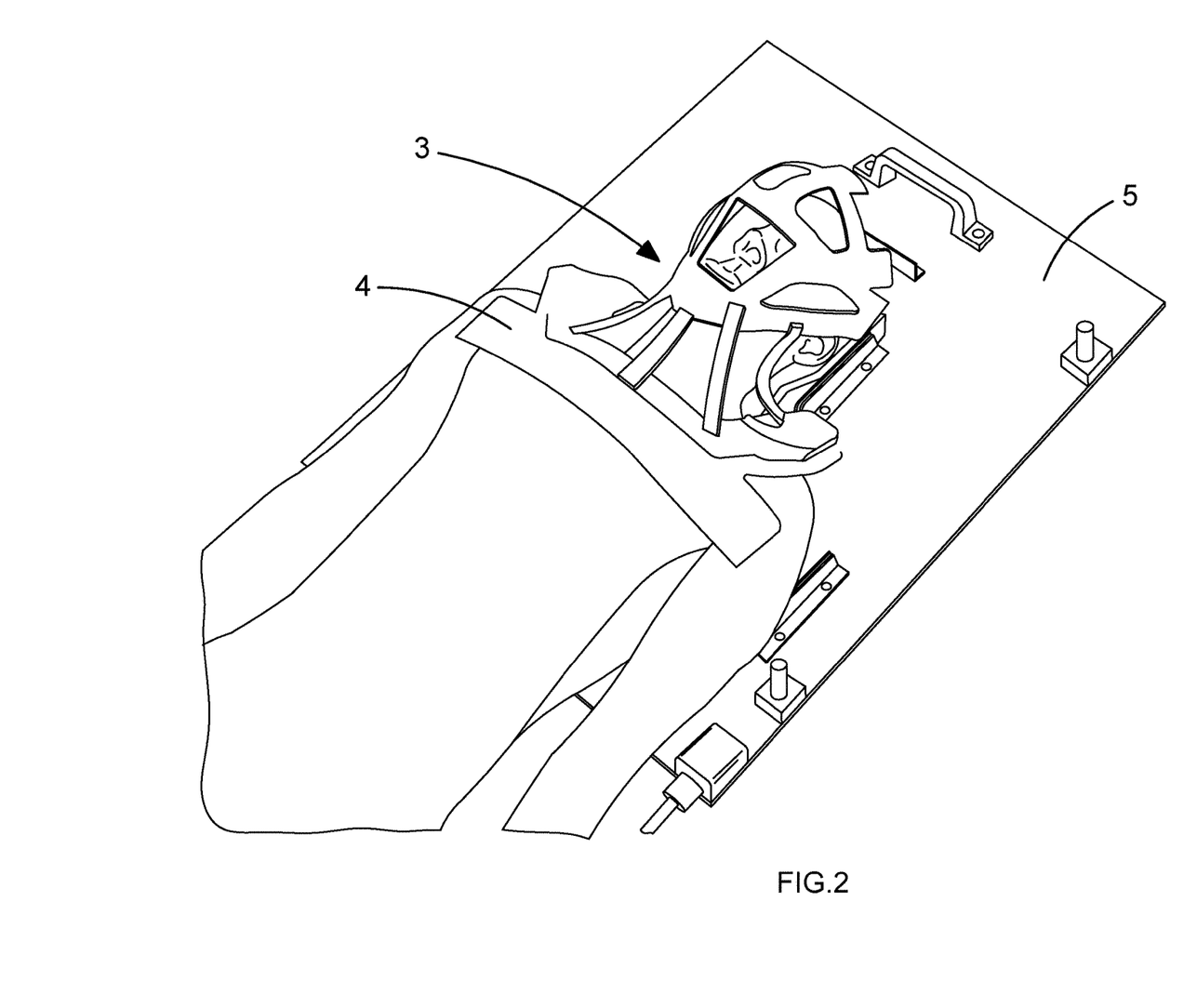
FIG. 2 schematically shows a receive coil arrangement of the type included in the MRI system of FIG. 1 in position on a subject.
Figure 3:
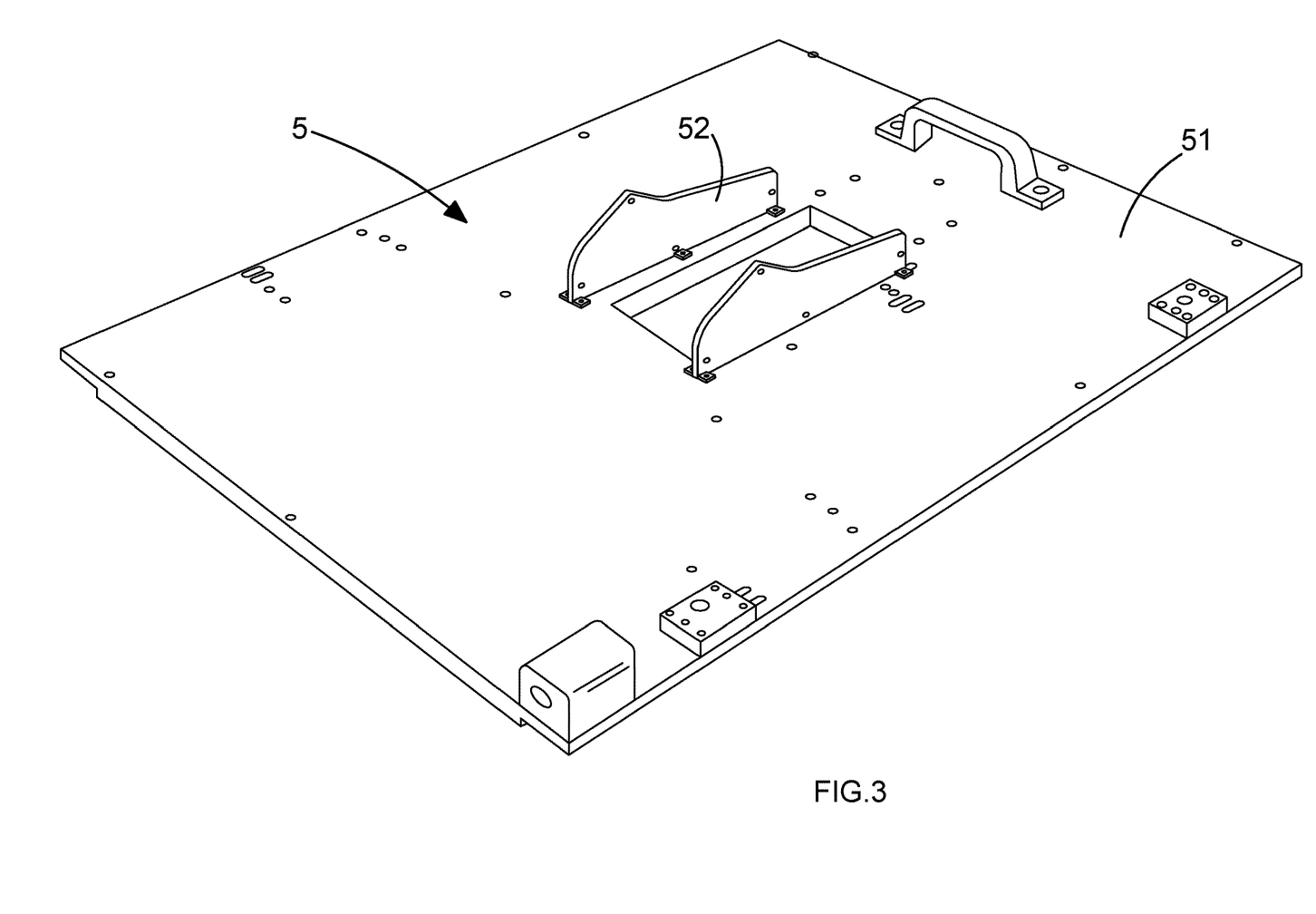
FIG. 3 schematically shows a base plate of the receive coil arrangement shown in FIG. 2.

FIG. 2 schematically shows the body part specific receive coil arrangement 3 in more detail. The body part specific receive coil arrangement 3 comprises a cover portion 4 and base portion 5. The base portion 5 is arranged to either be rested upon the patient support 2 or in some embodiments may be made to be an integral part of the patient support 2. On the other hand, the cover portion 4 is removably mounted on the base portion 5 so that it may be fitted over a subject and then secured in position on the base portion 5.

Figure 4:
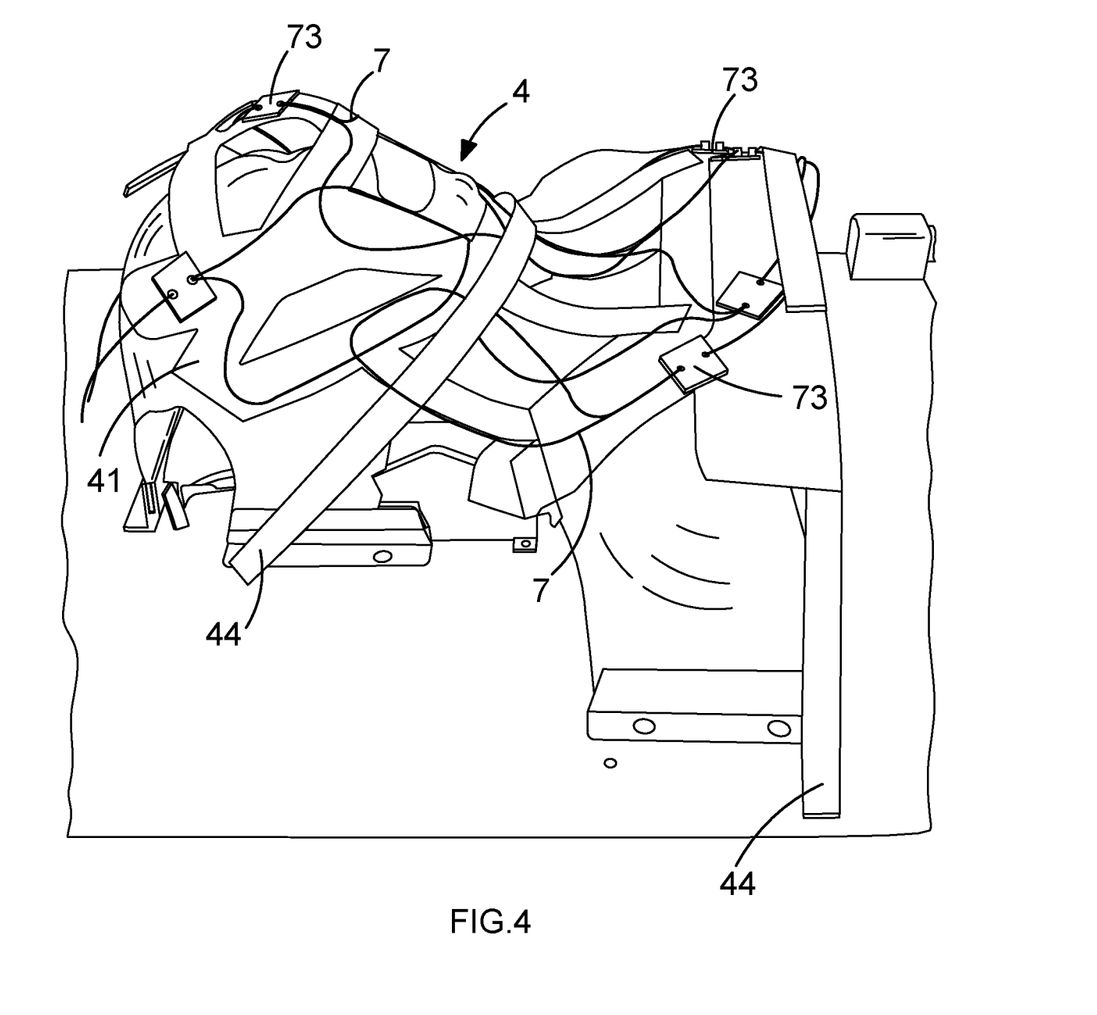
FIG. 4 schematically shows a cover portion of the receive coil arrangement shown in FIG. 2.
Figure 5:
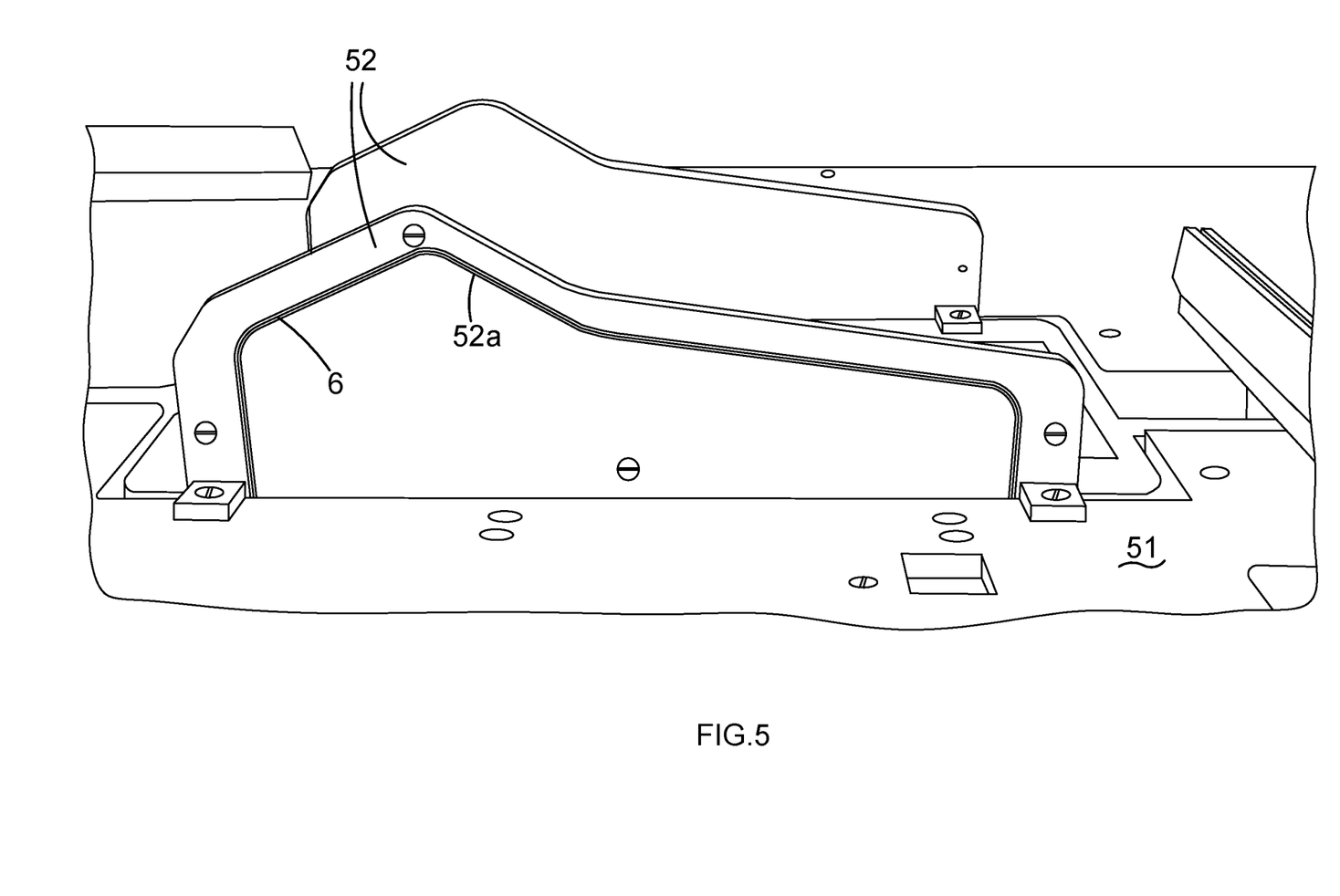
FIG. 5 shows in more detail part of the base plate shown in FIG. 3 which part is arranged for receiving a primary receive coil.

As may be seen by considering FIGS. 3, 4, 5, and 6 the body specific receive coil arrangement 3 comprises a primary receive coil 6 (see FIGS. 5 and 6) and a plurality of auxiliary receive coils 7 (see FIG. 4). The base portion 5 is arranged for supporting the primary receive coil 6 and the cover portion 4 is arranged for supporting the auxiliary receive coils 7.

Figure 6:
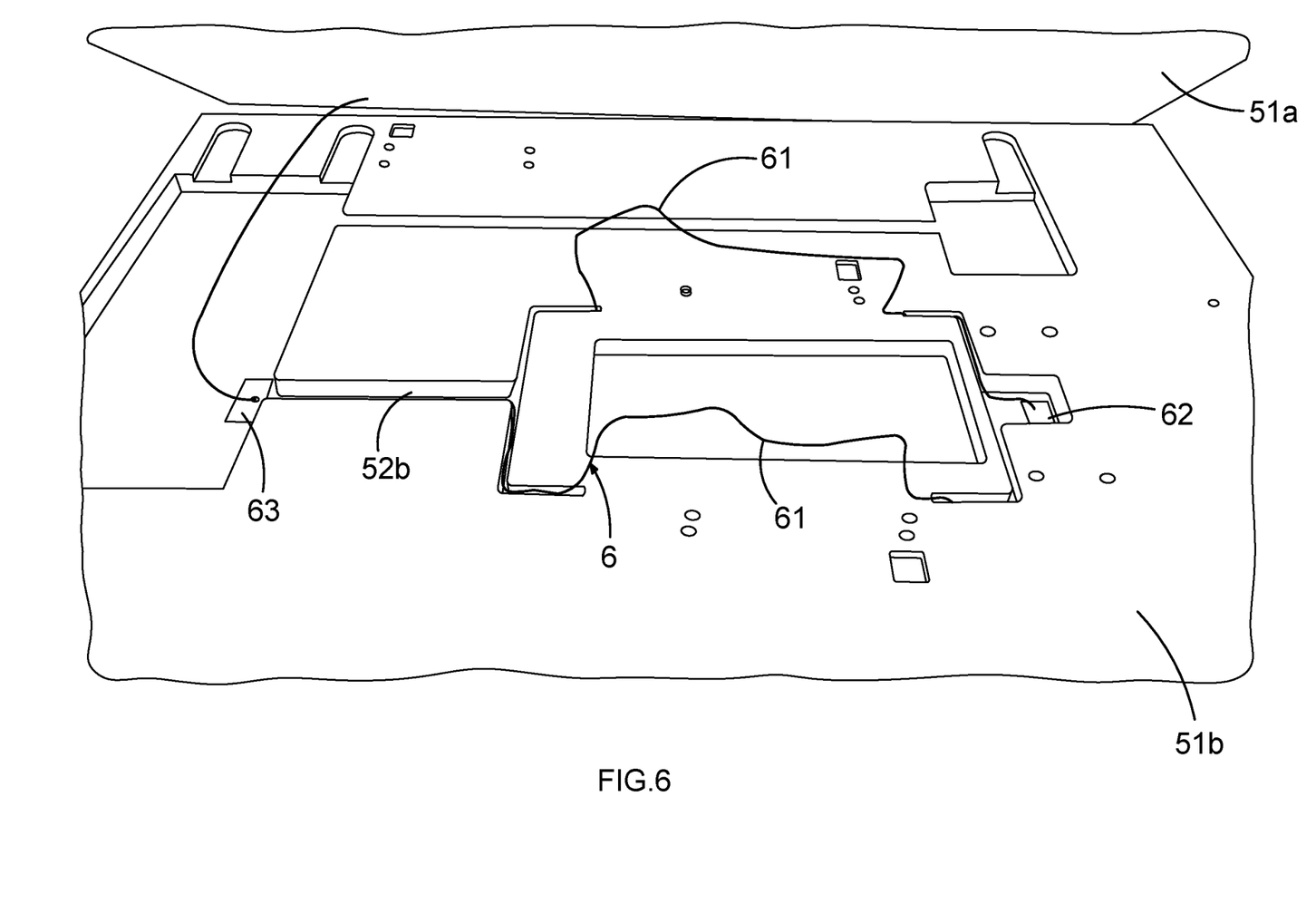
FIG. 6 shows the primary receive coil in the base plate but with part of the base plate removed.

The base portion 5 comprises a plate portion 51 and two upstanding portions 52. The upstanding portions 52 can be seen for example in FIGS. 3 and 5. The plate portion 51 has two layers 51a and 51b. The upstanding portions 52 are carried on the upper layer 51a as visible in FIGS. 3 and 5. In FIG. 6 the upper layer 51a is raised to show the lower layer 51b and to better show the primary receive coil 6.

The base portion 5 is provided with a plurality of channels 52a, 52b for supporting the primary receive coil 6 and holding it in a predefined position. A respective channel 52a (only one of which can be seen in the drawings i.e. in FIG. 5) is provided in each of the upstand portions 52 for holding a respective portion of the primary receive coil 6 in position in the upstand portion 52.

As will be appreciated by considering together for example, FIGS. 2, 3, 4 and 5, in use this portion of the primary receive coil 6 will be in close proximity to the subject, in particular the subject's head in the specific embodiment shown. The particular shape and path of the coil 6 is chosen to give desired receive characteristics for example to maximize penetration depth and ensure relatively constant electromagnetic coupling of energy to the tissue of the subject.

The lower layer 51b of the plate portion 51 includes respective channels 52b for holding the other parts of the primary receive coil 6 in position.

The primary receive coil 6 comprises unshielded lengths of conductor. In the present embodiment, two portions of unshielded conductor 61 are provided. The first of which runs in the channel 52a of the first of the upstands 52 and the second of which runs in the channel 52a of the other upstand 52. First ends of these conductor portions 61 are connected to a detune board 62 whilst other respective ends of the two conductor portions 61 are connected to a matching board 63. The detune board 62 and matching board 63 each comprise at least one electronic component, such as at least one tuning capacitor in the case of the matching board 63.

As seen in FIG. 6 the detune board 62 and matching board 63 are kept out of a central region of the coil 6, that is they are away from the location of the upstand portions 52 and those portions of the coil 6 which will be nearest a portion of interest in the subject. This creates an electronic component free zone in the region of interest of the subject. This is of particular interest where the body specific receive coil arrangement 3 is to be used in a combination system of the type described above where radiation is used in the combination system. Radiation may pass through this central region i.e. the region of interest in the subject without being adversely affected by the presence of electrical components and/or without risk of damage to such electrical components. Thus, this arrangement of the primary receive coil 6 helps the use of the present receive coil arrangement in systems such as PET-MR and MR-Linac systems.

The base portion 5, that is the plate portion 51 and the upstand portion 52 are of a relatively rigid plastics material for holding the primary receive coil 6 in a pre-defined position.

As alluded to above, this is important because alteration of the shape of the primary receive coil 6 will tend to affect tuning and matching that will negatively impact the sensitivity of the primary receive coil 6. The rigid construction and the coil's 6 shape and positioning have been chosen to minimise these effects.

Each of the auxiliary receive coils 7 has a different structure from the primary receive coil 6. Whilst the primary receive coil 6 is made of an unshielded conductor and has relatively low impedance, the auxiliary receive coils 7 are arranged as high impedance coils. In particular these coils 7 have higher impedance than that of the primary receive coil 6. Furthermore, the size of the auxiliary receive coils 7 is smaller than that of the primary receive coil 6, in particular the area which the auxiliary receive coils 7 bound is smaller than the area which the primary receive coil 6 bounds. This means that the primary receive coil 6 is better suited for receiving signals emanating from deep inside the subject whereas the auxiliary receive coils 7 are better suited for picking up signals emanating from a region of the subject close to the auxiliary receive coil 7 itself.

Further, due to the nature of the high impedance coils used for the auxiliary receive coils 7, they couple much less with their environment and thus the precise positioning is less important. This leads to the possibility of more accurately locating these auxiliary receive coils 7 in relation to a subject and allowing these receive coils 7 to conform to the shape necessary to put them into close contact with the relevant regions of interest in the subject.

Figure 7:
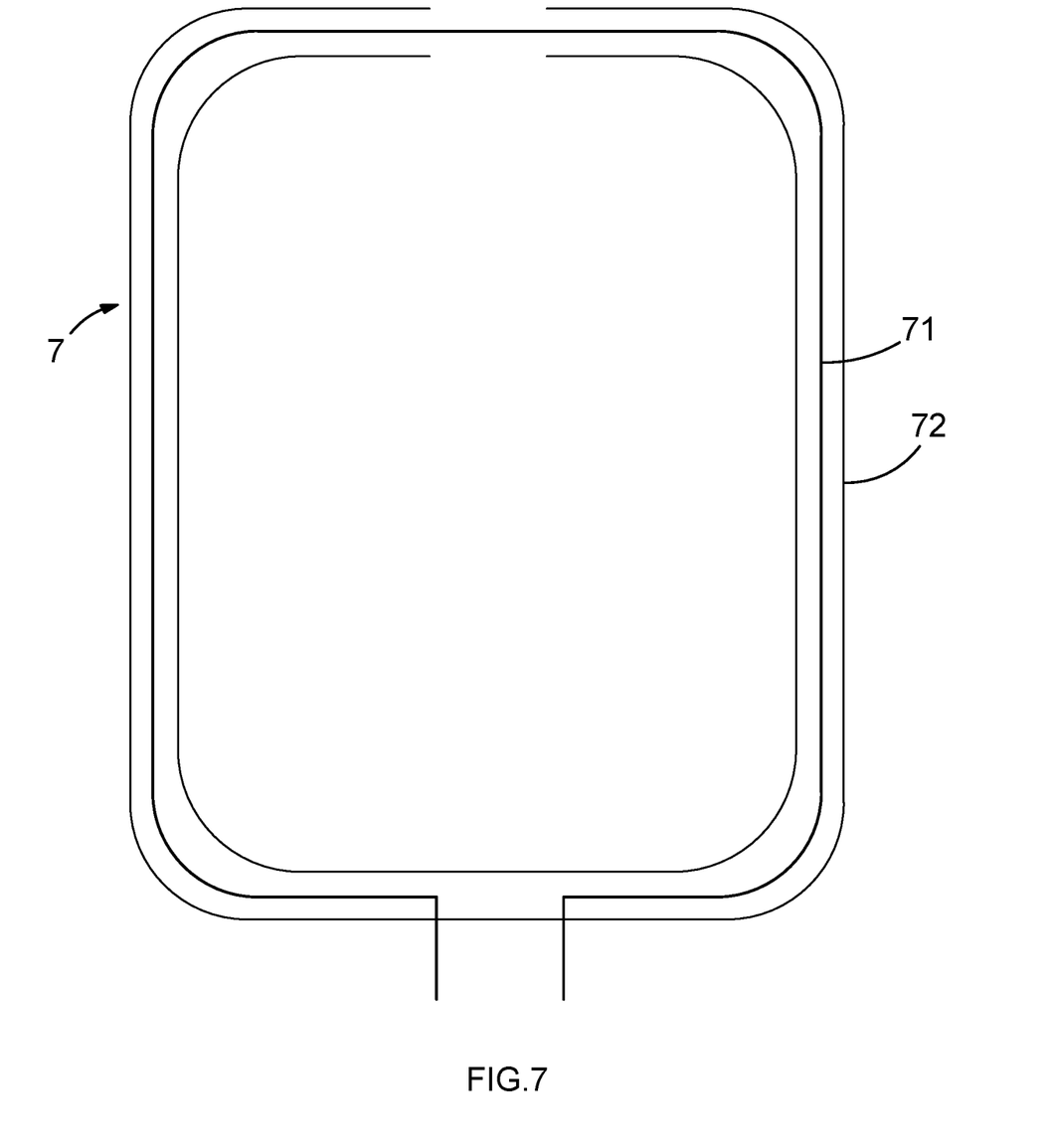
FIG. 7 schematically illustrates the connection arrangement of an auxiliary receive coil included in the receive coil arrangement shown in FIG. 2.

FIG. 7 schematically shows the connection arrangement of each of the auxiliary receive coils 7. Each auxiliary receive coil 7 is made out of a length of coaxial cable comprising a central conductor 71 and an outer shield conductor 72. In the receive coil the central conductor 71 is continuous around the coil and the ends of the central conductor 71 are connected to a respective matching board 73 (see FIG. 4). On the other hand, the shield conductor 72 is provided with a gap at a location remote from the ends of the inner conductor 71 whilst the two ends of the shield 72 near the ends of the inner conductor 71 are connected together. The matching boards 73 each comprise at least one electronic component, such as at least one tuning capacitor.

Due to the nature of the high impedance coils, the total length of each coaxial cable that defines the coil is restricted to close proximity to a half wavelength, thereby limiting the overall size of the auxiliary receive coils 7.

Each of these auxiliary receive coils 7 is supported by a plastic substrate 41 of the cover portion 4. The auxiliary receive coils 7 may be held in position with stitching—say using a textile material yarn. In the present embodiment the substrate 41 is of a relatively flexible plastics material and overall, this substrate 41 and the cover portion 4 are much more flexible than the base portion 5. As the substrate 41 is flexible, the auxiliary coils 7 are flexible, and the auxiliary coils 7 can operate effectively when taking up a desired position this means that the cover portion 4 can be designed to closely fit the area of a subject which is of interest.

Thus, in the present embodiment the cover portion 4 is arranged for location on the head, face and neck of a patient. It correspondingly includes portions of the cover for covering the head, face and neck of the subject when in position.

The cover portion 4 in combination with the auxiliary coils 7 can be termed a cover portion arrangement 4, 7. The base portion 5 in combination with the primary coil 6 can be termed a base portion arrangement 5, 6.

Figure 8A:
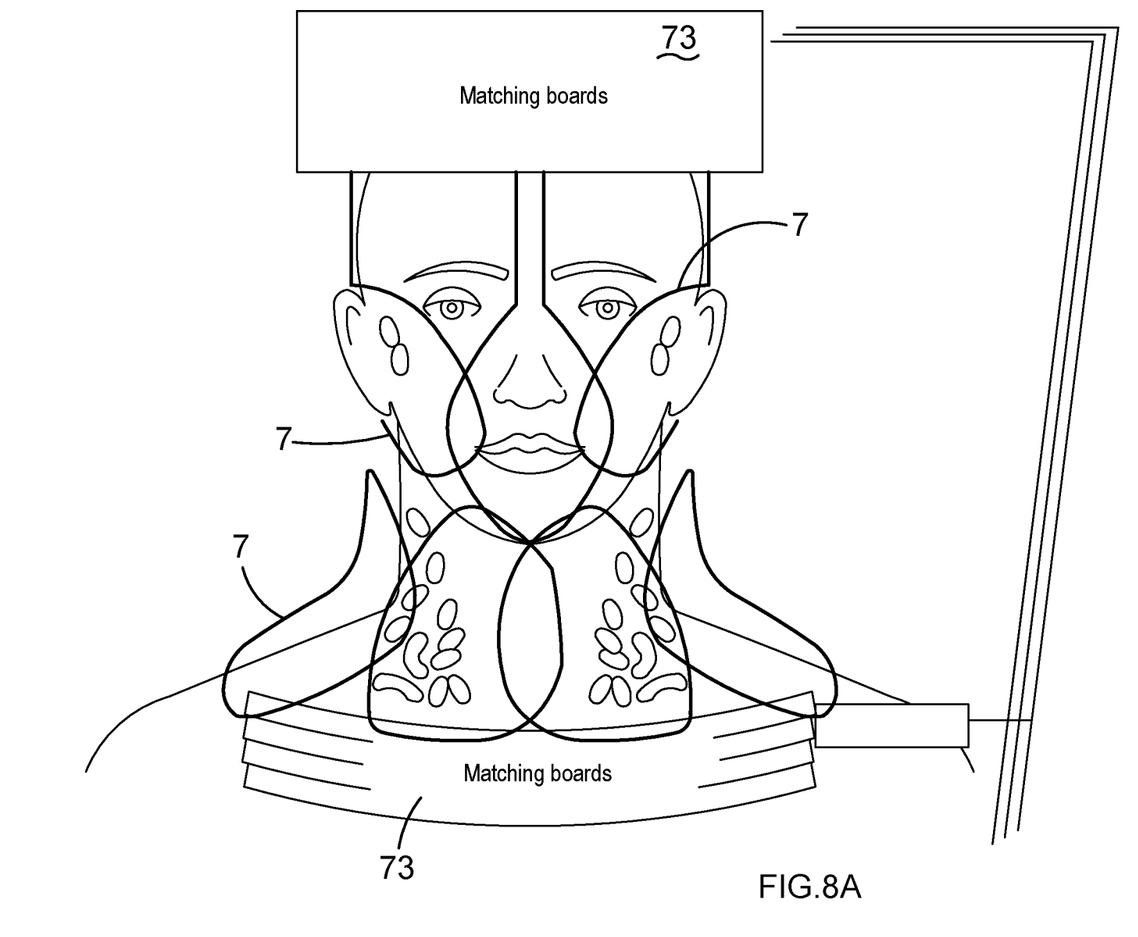
FIGS. 8A and 8B respectively show a front view and side view schematic of the primary and auxiliary coils of the receive coil arrangement of FIG. 2 when positioned around a subject.
Figure 8B:
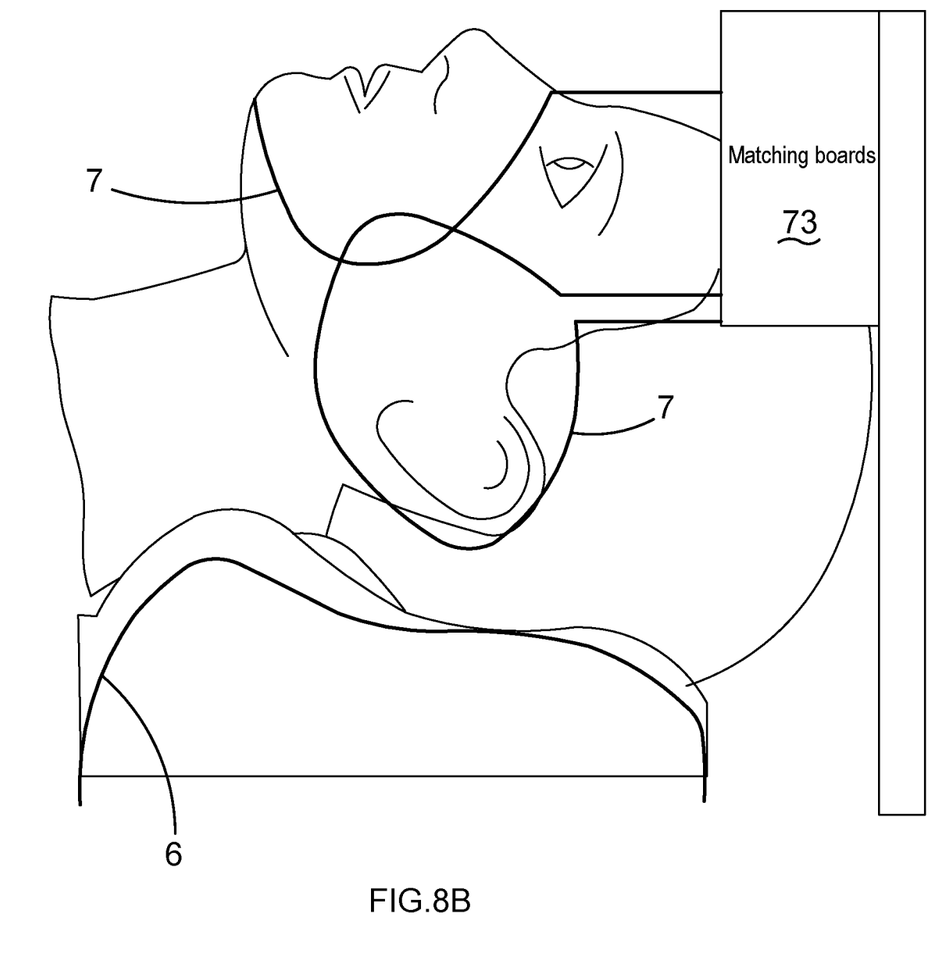

The locations of the primary coil 6 and auxiliary coils 7 in relation to a subject when the subject is positioned on the base portion 5 and cover portion 4 is in position, may be best seen in FIGS. 8A and 8B.

In this instance, the primary coil 6 can be seen located in the region of the patient's head. The primary coil 6 has greater facility for acquiring data from a greater depth within the subject. This receive coil 6 may usefully pick up signals generated from any region within the patient's head and neck.

On the other hand, the auxiliary coils 7 are located at differing locations over the patient's face and neck. There is partial overlapping between each auxiliary coil 7 but largely each auxiliary coil 7 is looking to pick up signals from a different area of face and neck of the subject. In this embodiment there are seven auxiliary coils 7, three of which are arranged for location over a subject's face and four of which are arranged for location over a subject's neck and shoulder. Correspondingly, if one thinks of the cover portion 4 as illustrated for example, in FIG. 4, four of auxiliary coils 7 are provided on the neck covering portion of the cover and three of the auxiliary coils 7 are provided on the face covering portion of the cover 4.

The auxiliary coils 7 are arranged, in this embodiment, to overlap each other by in the region of 10-15% to further reduce residual inductive coupling.

Again, the matching boards 73 for the auxiliary coils 7 are kept out of the central region i.e. the region of interest in the subject so that there is an electronic component free zone giving the benefits described above.

In practice, the substrate 41, auxiliary coils 7, and matching boards 73 of the cover portion arrangement 4, 7 will be covered by a layer of foam provided on each side of the substrate 41. In the present embodiment the cover portion 4 is arranged to be held in position on the base portion 5 using hook and loop fasteners 44 provided at appropriate attachment locations.

Note that the flexible design of the cover 4 as well as the fact that the auxiliary coils 7 are tolerant to being provided in different positions and bent into slightly different shapes, facilitates the provision of a cover portion arrangement 4, 7 which may be used over a mask or other jig which needs to be used in a combined system. For example, in a MR-Linac system where a patient specific immobilization mask or jig is provided for appropriately directing the radiation used in the radiotherapy to be delivered by the MR-Linac system, a cover portion 4 of the present kind may be used in conjunction with that existing mask or jig without needing to modify it.

Figure 9:
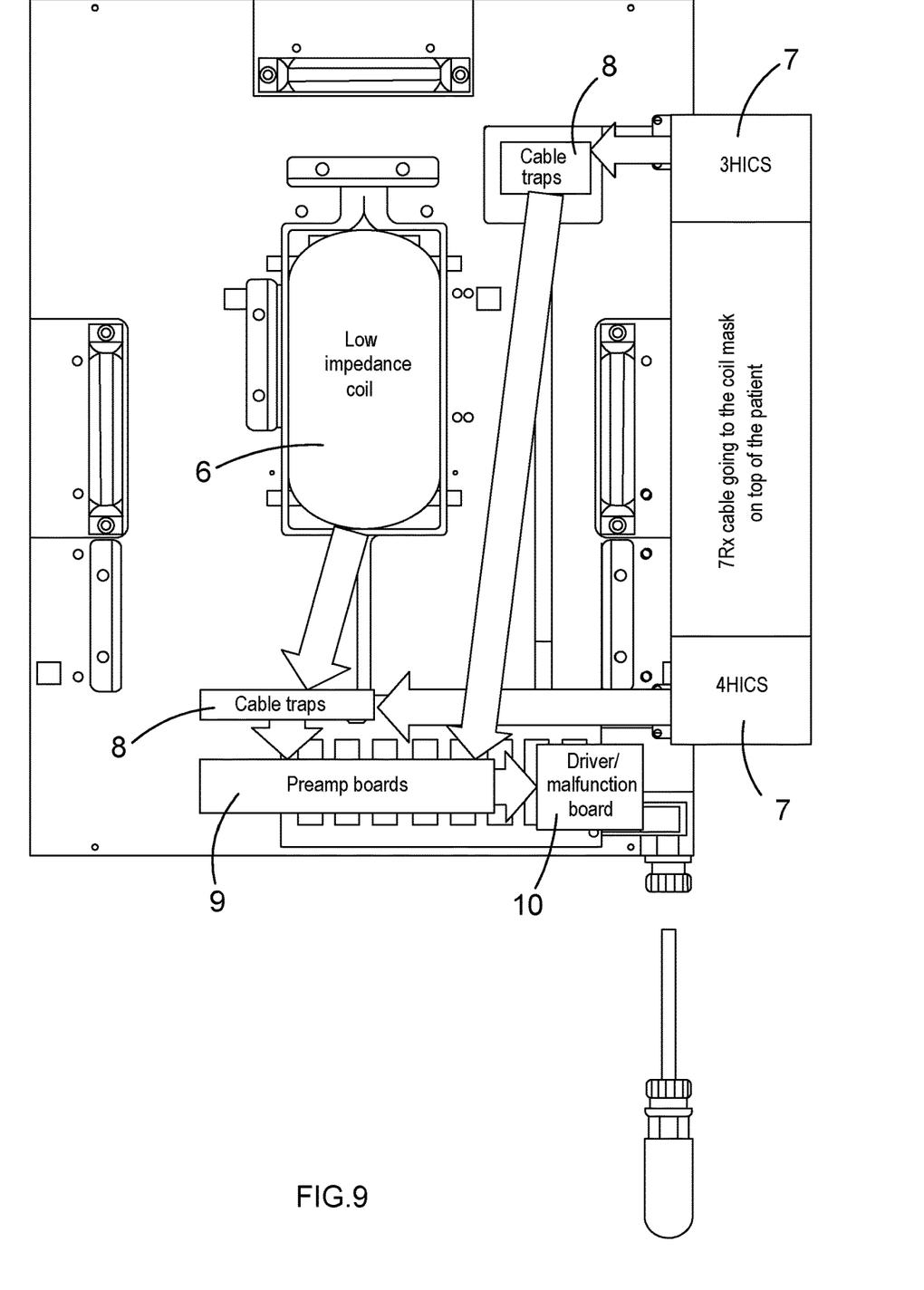
FIG. 9 is a schematic showing connections between various components in the receive coil arrangement shown in FIG. 2.

FIG. 9 is a schematic showing the overall connection arrangement of the receive coil arrangement shown in FIGS. 2-8. The low impedance primary coil 6 and the high impedance auxiliary coils 7 are connected via appropriate cable traps 8 to preamp boards 9, the output of which is fed to a driver malfunction board 10 and the output of this becomes the output of the receive coil arrangement 3 as a whole for feeding into the main MRI scanner arrangement 1.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An Mill system receive coil arrangement for use with a main MM scanner arrangement and comprising at least one primary receive coil having a first impedance at a predetermined frequency and a first size defined by a cross-sectional area bounded by the primary receive coil and at least one auxiliary receive coil having a second impedance at said predetermined frequency and a second size defined by a cross-sectional area bounded by the auxiliary receive coil wherein the first impedance is lower than the second impedance and the first size is larger than the second size, wherein the auxiliary receive coil comprises at least one length of coaxial cable, the primary receive coil comprises at least one unshielded conductor portion, and the auxiliary receive coil is more flexible than the primary receive coil.

2. An Mill system receive coil arrangement according to claim 1 in which the receive coil arrangement comprises a plurality of auxiliary receive coils each of which has an impedance at said predetermined frequency which is higher than the first impedance and each of which has a size defined by a cross-sectional area bounded by the respective auxiliary receive coil which is smaller than the first size.

3. An Mill system receive coil arrangement according to claim 1 which comprises support structure on which at least one of the primary receive coil and the auxiliary coil is carried.

4. An Mill system receive coil arrangement according to claim 3 in which the support structure comprises at least two portions, a first of which portion carries the primary receive coil and a second of which portions carries the auxiliary receive coil.

5. An Mill system receive coil arrangement according to claim 4 in which the at least two portions of the support structure are arranged to be moveable between an access configuration allowing location of a subject between the two portions of the support structure and an operative configuration for locating the primary receive coil and auxiliary receive coil in a desired location relative to one another for use during imaging operation of an MM machine with which the receive coil arrangement is to be used.

6. An MRI system receive coil arrangement according to claim 4 in which the support portion supporting the at least one auxiliary receive coil is more flexible than the support portion supporting the primary receive coil.

7. An MRI system receive coil arrangement according to claim 4 in which one of the at least two support portions comprises a base portion for resting on, or incorporation into, a patient support bed of an MRI machine.

8. An MRI system receive coil arrangement according to claim 7 in which the other of the least two support portions comprises a cover portion for mounting on the base portion.

9. An MRI system receive coil arrangement according to claim 8 in which the base portion carries the primary receive coil and the cover portion carries the auxiliary receive coil.

10. An MRI system receive coil arrangement according to claim 8 in which the cover portion comprises a plurality of covering portions, each for covering a respective portion of interest in a subject, there are a plurality of auxiliary coils and at least one respective auxiliary receive coil in the plurality of auxiliary receive coils is provided on a respective covering portion in the plurality of covering portions.

11. An MRI system receive coil arrangement according to claim 7 in which the base portion comprises at least part of a pillow portion for supporting a subject's head.

12. An MRI system receive coil arrangement according to claim 1 in which the receive coil arrangement is a head and/or face and/or neck and/or shoulder receive coil arrangement.

13. An MRI system receive coil arrangement according to claim 1 in which the receive coil arrangement is arranged to allow use in addition to, that is, around an immobilization mask or other jig provided for radiotherapy treatment.

14. An MRI system receive coil arrangement according to claim 1 in which the receive coil arrangement comprises an electronic component free zone which corresponds to a zone at which radiation may pass in use, say a radiotherapy beam applied during use, or radiation for use in forming images.

15. An MRI system receive coil arrangement according to claim 1 in which the at least one auxiliary receive coil comprises a length of coaxial cable arranged in a loop with a gap provided in the outer conductor of the coaxial cable at a location partway around the loop and with the outer conductor at a first end of the length of coaxial cable being connected to the outer conductor at a second end of the length of coaxial cable.

16. An MRI system comprising a main MRI scanner arrangement, a patient support, and an MM system receive coil arrangement according to claim 1 provided on the patient support and electrically connected to the main MRI scanner arrangement.

17. An MR-Linac system comprising an MM system according to claim 16 and a medical linear accelerator system.

18. A PET-MR system comprising an MM system according to claim 16 and a positron emission tomography system.

19. An Mill system receive coil arrangement according to claim 1, further comprising a support structure on which the auxiliary receive coil is carried, wherein the support structure is a cover portion comprising a substrate.

20. An Mill system receive coil arrangement according to claim 1, further comprising a support structure on which the auxiliary receive coil is carried, wherein the nature and structure of the auxiliary receive coil assists in mounting the auxiliary receive coil to the support structure.

21. An Mill system receive coil arrangement according to claim 1, wherein the nature and structure of the auxiliary receive coil allows it to be accurately located in relation to a subject.

22. An Mill system receive coil arrangement according to claim 1, wherein the nature and structure of the auxiliary receive coil allows conformation to a shape necessary to put it in close contact with the relevant regions of interest of a subject.

23. An Mill system receive coil arrangement according to claim 1, comprising a plurality of auxiliary receive coils which overlap each other by 10-15%.

24. An Mill system receive coil arrangement for use with a main MM scanner arrangement and comprising at least one primary receive coil having a first impedance at a predetermined frequency and a first size defined by a cross-sectional area bounded by the primary receive coil and at least one auxiliary receive coil having a second impedance at said predetermined frequency and a second size defined by a cross-sectional area bounded by the auxiliary receive coil wherein the first impedance is lower than the second impedance and the first size is larger than the second size, wherein the auxiliary receive coil comprises at least one length of coaxial cable, the primary receive coil comprises at least one unshielded conductor portion, and the auxiliary receive coil is bendable into position on a support made to closely fit an area of a subject which is of interest.

25. An Mill system receive coil arrangement for use with a main MM scanner arrangement and comprising at least one primary receive coil having a first impedance at a predetermined frequency and a first size defined by a cross-sectional area bounded by the primary receive coil and at least one auxiliary receive coil having a second impedance at said predetermined frequency and a second size defined by a cross-sectional area bounded by the auxiliary receive coil wherein the first impedance is lower than the second impedance and the first size is larger than the second size, wherein the auxiliary receive coil comprises at least one length of coaxial cable, the primary receive coil comprises at least one unshielded conductor portion, and the auxiliary receive coil is more readily bendable than the primary receive coil.

* * * * *

UNITED STATES PATENT AND TRADEMARK OFFICE
CERTIFICATE OF CORRECTION

PATENT NO. : 11,686,791 B2
APPLICATION NO. : 17/517759
DATED : June 27, 2023
INVENTOR(S) : Dennis Klomp et al.

Page 1 of 1

It is certified that error appears in the above-identified patent and that said Letters Patent is hereby corrected as shown below:

On the Title Page
Add item (30):
--(30) Foreign Application Priority Data
Nov. 4, 2020 (GB)..............................2017436--.

In the Claims
Column 9, Claim 1, Line 65, remove "Mill" and insert --MRI--.
Column 9, Claim 1, Line 66, remove "MM" and insert --MRI--.
Column 10, Claim 2, Line 12, remove "Mill" and insert --MRI--.
Column 10, Claim 3, Line 19, remove "Mill" and insert --MRI--.
Column 10, Claim 4, Line 23, remove "Mill" and insert --MRI--.
Column 10, Claim 5, Line 28, remove "Mill" and insert --MRI--.
Column 10, Claim 5, Line 35, remove "MM" and insert --MRI--.
Column 11, Claim 16, Line 17, remove "MM" and insert --MRI--.
Column 11, Claim 17, Line 21, remove "MM" and insert --MRI--.
Column 11, Claim 18, Line 24, remove "MM" and insert --MRI--.
Column 11, Claim 19, Line 26, remove "Mill" and insert --MRI--.
Column 11, Claim 20, Line 30, remove "Mill" and insert --MRI--.
Column 11, Claim 21, Line 35, remove "Mill" and insert --MRI--.
Column 12, Claim 22, Line 1, remove "Mill" and insert --MRI--.
Column 12, Claim 23, Line 6, remove "Mill" and insert --MRI--.
Column 12, Claim 24, Line 9, remove "Mill" and insert --MRI--.
Column 12, Claim 24, Line 10, remove "MM" and insert --MRI--.
Column 12, Claim 25, Line 24, remove "Mill" and insert --MRI--.
Column 12, Claim 25, Line 25, remove "MM" and insert --MRI--.

Signed and Sealed this
Twenty-second Day of October, 2024

Katherine Kelly Vidal
*Director of the United States Patent and Trademark Office*